United States Patent [19]

Arnould

[11] 4,348,545

[45] Sep. 7, 1982

[54] PROCESS FOR MOUNTING A PROTECTION DIODE ON A VERTICAL MULTIJUNCTION PHOTOVOLTAIC CELL STRUCTURE AND PHOTOVOLTAIC CELLS OBTAINED

[75] Inventor: Jacques Arnould, Paris, France

[73] Assignee: Le Silicium Semiconducteur SSC, Paris, France

[21] Appl. No.: 229,262

[22] Filed: Jan. 28, 1981

[30] Foreign Application Priority Data

Feb. 1, 1980 [FR] France ................. 80 02253

[51] Int. Cl.³ ...................... H01L 31/06; H01L 31/18
[52] U.S. Cl. ....................................... 136/244; 29/572
[58] Field of Search ........................... 136/244; 29/572

[56] References Cited

U.S. PATENT DOCUMENTS 3,422,527 1/1969 Gault ..................................... 29/572
3,952,324 4/1976 Wolff et al. ........................... 357/19

Primary Examiner—Aaron Weisstuch
Attorney, Agent, or Firm—Cushman, Darby & Cushman

[57] ABSTRACT

In a stack of diodes forming a vertical multijunction photovoltaic cell, an inversely connected diode is firmly secured to this stack with possible insertion of a intermediate wafer made from a conducting material.

12 Claims, 5 Drawing Figures

PROCESS FOR MOUNTING A PROTECTION DIODE ON A VERTICAL MULTIJUNCTION PHOTOVOLTAIC CELL STRUCTURE AND PHOTOVOLTAIC CELLS OBTAINED

BACKGROUND OF THE INVENTION

The present invention relates to an arrangement for mounting a protection diode on a vertical multijunction photovoltaic diode structure and a photovoltaic cell obtained by this process.

FIG. 1 shows schematically a conventional solar cell circuit. An assembly of photovoltaic diodes in series 1 feeds into a battery of accumulators 2 serving as a buffer battery for continuing to supply energy when the solar cells 1 are not illuminated. It is furthermore necessary to provide a protection diode 3 so that, when the photovoltaic diodes 1 are not illuminated, the battery 2 is not discharged by these diodes.

In practice, two large groups of solar cells are distinguished, the solar cells operating with normal light and solar cells operating with concentrated light. Among these latter, we will be here concerned more particularly with the laterally illuminated vertical multijunction cells, which are described for example in the article by B. L. Sater et al published in the work entitled "Solar Cells", edited by C. E. Backus, I.E.E.E. Press (1976).

There will be recalled rapidly with reference to FIGS. 2, 3 and 4 the structure of such vertical multijunction diodes. This structure is produced from silicon wafers 10 comprising a substrate 11 with a low doping level, covered on each of its faces with a layer of opposite conductivity type (respectively P and N 12 and 13).

As shown also in a side view in FIG. 3, a large number of wafers 10 is then stacked and these wafers are fixed to each other by means of a metal alloy. As the top view of FIG. 4 shows, this stack of wafers is then cut up for example by means of a saw along the lines designated by reference numerals 20 and 21. Thus an assembly of elementary vertical multijunction bars or cells is obtained which may be used with concentrated light by lateral illumination. Then, since the height of the stack, which may be relatively high and comprise more than 100 wafers, is nevertheless limited, it may be desired to mount in series or in parallel, an assembly of elementary cells such as those obtained subsequent to the operation described with reference to FIG. 4.

The elementary cell or the assembly of elementary cells mounted in series or parallel corresponds to assembly 1 shown in FIG. 1. It is then a matter of connecting to this assembly diode 3 which is conventionally effected by means of an external connection in the devices of the prior art. Furthermore, in the case where several elementary cells are mounted in parallel, if it is desired to avoid the risks of discharging one assembly of cells in another should one of these elementary assemblies not be suitably illuminated, it is advisable to dispose inversely connected diodes such as diode 3 in series with each elementary cell before mounting them in parallel, which considerably complicates the mounting operations.

Thus, an object of the present invention is to provide a process for the reverse mounting of a protection diode in a vertical multijunction photovoltaic cell structure which simplifies the mounting procedure and avoids the user making any possible error of mounting.

SUMMARY OF THE INVENTION

To attain this object and others, the present invention provides a process for mounting a protection diode in a structure of vertical multijunction photovoltaic diodes consisting in stacking photovoltaic diode wafers having the same orientation, in securing them firmly to one another and in cutting this stack up into bars perpendicularly to the direction of the wafers, comprising further, before the step of cutting up the stack, a step of disposing on the stack a diode wafer whose polarity is the reverse of that of the other diodes and in firmly securing this diode to the stack. A conducting wafer may be inserted in series between the stack of photovoltaic diodes and the reverse diode. This conducting wafer may be a heavily-doped silicon wafer. The reversely mounted diode wafer may be identical to the other wafers of the stack and differ therefrom only by its orientation.

Thus, the present invention relates to an integrated photovoltaic cell in the form of a bar comprising a stack of photovoltaic diodes having the same polarity further comprising a reversely connected diode integral with the other diodes.

DESCRIPTION OF THE PREFERRED EMBODIMENT

Figure 1:
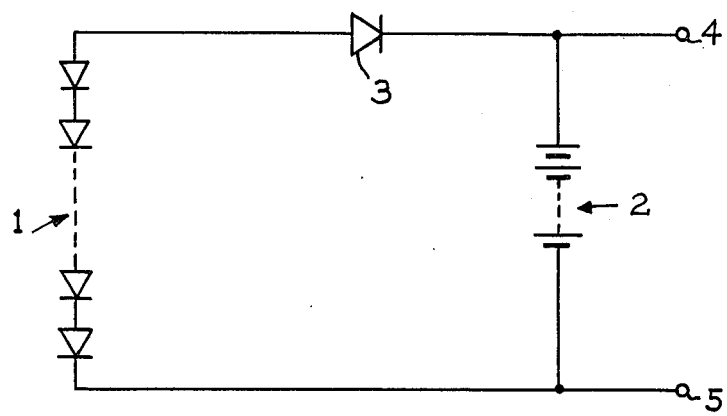
FIGS. 1 to 4 have already been described above and were intended to outline the context into which the present invention fits.
Figure 2:
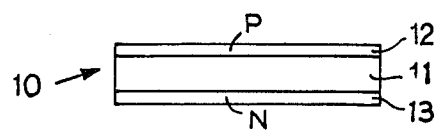
Figure 3:
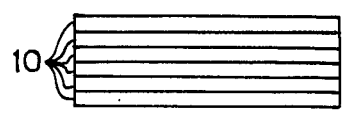
Figure 4:
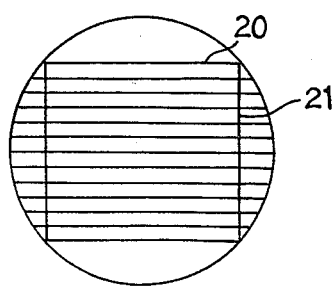
Figure 5:
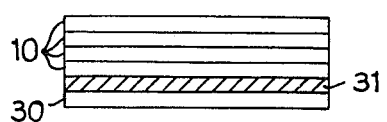
FIG. 5 illustrates very schematically one embodiment of the present invention.

FIG. 5 shows in section a stack of diodes 10 such as the stack already shown in FIG. 3. In addition to this stack there is provided an additional diode wafer 30 fixed to stack 10 with the reverse polarity to that of the other diodes forming the stack. Then, the stack of wafers is cut up in the manner stated above the reference to FIG. 4 and so there is obtained an integrated protection diode with an elementary vertical multijunction photovoltaic diode cell.

As FIG. 5 also shows, diode 30 may be fixed to the diode stack 10 by means of an insert wafer 31 having a thickness substantially greater than that of the inserts used between the elementary diodes 10 for fixing them to each other. This insert wafer must be made from a conducting material and may for example be formed from a heavily doped silicon wafer. Thus, in use, the assembly illustrated in FIG. 5 may be possibly disposed so that the junction of diode 30 is not illuminated, which reduces slightly the voltage drop caused by this diode.

Diode 30 may be of the same type as the other diodes of the vertical multijunction cell or else be manufactured separately so as to optimize its forward voltage drop and reverse leak characteristics.

The present invention is not limited to the embodiments which have been explicitly described above; but comprises the different variations and generalizations thereof included within the scope of the following claims.

What is claimed is:

1. In a process for mounting a protection diode on a vertical multijunction photovoltaic cell structure comprising the steps of (a) stacking photovoltaic diode wafers having the same orientation, (b) securing them firmly to each other and (c) cutting them into bars perpendicular to the direction of the wafers, the improvement comprising essentially and in combination with steps (a), (b) and (c), before the cutting step, the additional steps of (b') disposing on the stack a diode wafer having the reverse polarity of that of the other diodes and (b'') securing this diode to the stack.

2. The improved process as claimed in claim 1, wherein there is further provided a step of inserting a conducting wafer between the photo-voltaic diode stack and the reversely connected diode.

3. The improved process as claimed in claim 2, wherein the step of inserting a conducting wafer comprises the step of inserting a conducting wafer formed from heavily doped silicon.

4. The improved process as claimed in claims 1, 2 or 3, wherein the step (b') comprises the step of disposing on the stack a reversely connected diode wafer that is identical to the other wafers of the stack.

5. An integrated photovoltaic cell of the vertical multijunction type in the form of a bar comprising:
a photovoltaic diode stack, and
a reversely connected diode integral with the other diodes.

6. An integrated photovoltaic cell, comprising:
a plurality of elementary diode wafers, all having the same polarity orientation and stacked so that they are electrically joined in series to form a photovoltaic vertical multi-junction stack having two faces; and
a protection diode integrally connected to the stack at one of its two faces and oriented so that its polarity is opposite to that of the stacked diodes.

7. A cell according to claim 6 wherein the diode wafers are substantially identical to one another and the protection diode is substantially identical to those of the stack even though it is attached to a face of the stack with an orientation to produce an opposite polarity to the stacked diode wafers.

8. A cell according to claim 6 or 7 further including a conducting wafer between the photovoltaic stack and the protection diode.

9. A cell according to claim 8 wherein the conducting wafer comprises a heavily doped silicon wafer.

10. A method for forming a protected photovoltaic stack, comprising the steps of:
forming a plurality of diode wafers;
stacking the diode wafers so that they have the same orientation and form a vertical multi-junction stack;
securing the stacked diode wafers to one another so that they are electrically connected in series with one another;
disposing on the stack an additional diode wafer oriented so that it has a polarity opposite to those of the stacked diodes and firmly securing this additional diode to a face of the stack to form a diode protected stack; and
cutting the diode protected stack into bars perpendicular to the direction of the stacked wafers.

11. A method according to claim 10 wherein the step of disposing includes the step of disposing a conducting wafer between the stacked diode wafers and the additional diode wafer.

12. A method according to claim 10 or 11 wherein the step of disposing includes the step of disposing on the stack an additional diode wafer that is substantially identical to the stacked diode wafers.

* * * * *